United States Patent [19]
Fukuden

[11] Patent Number: 5,805,023
[45] Date of Patent: Sep. 8, 1998

[54] HIGH FREQUENCY AMPLIFIER, RECEIVER, AND TRANSMITTER SYSTEM

[75] Inventor: Nobutoshi Fukuden, Kawasaki, Japan

[73] Assignee: Fujitsu Limited, Kawasaki, Japan

[21] Appl. No.: 550,564

[22] Filed: Oct. 31, 1995

[30] Foreign Application Priority Data

Nov. 1, 1994 [JP] Japan .................................. 6-268977

[51] Int. Cl.⁶ .......................... H03F 3/191; H03F 1/34
[52] U.S. Cl. ................................... 330/302; 330/293
[58] Field of Search ............................... 330/286, 293, 330/294, 302, 306, 307

[56] References Cited

U.S. PATENT DOCUMENTS 4,559,503  12/1985  Camand et al. .................... 330/302
5,406,226   4/1995  Cioffi et al. ....................... 330/306

*Primary Examiner*—Steven Mottola
*Attorney, Agent, or Firm*—Nikaido, Marmelstein, Murray & Oram LLP

[57] ABSTRACT

An amplifier is equipped with an input terminal and an output terminal and has a transistor as an amplifying element, said amplifier comprising:

a negative feedback circuit provided in said transistor; and a parallel circuit which includes an inductive element and a resistive element connected in series between the input terminal of said amplifier and an input terminal of said transistor, or between the output terminal of said amplifier and an output terminal of said transistor.

46 Claims, 11 Drawing Sheets

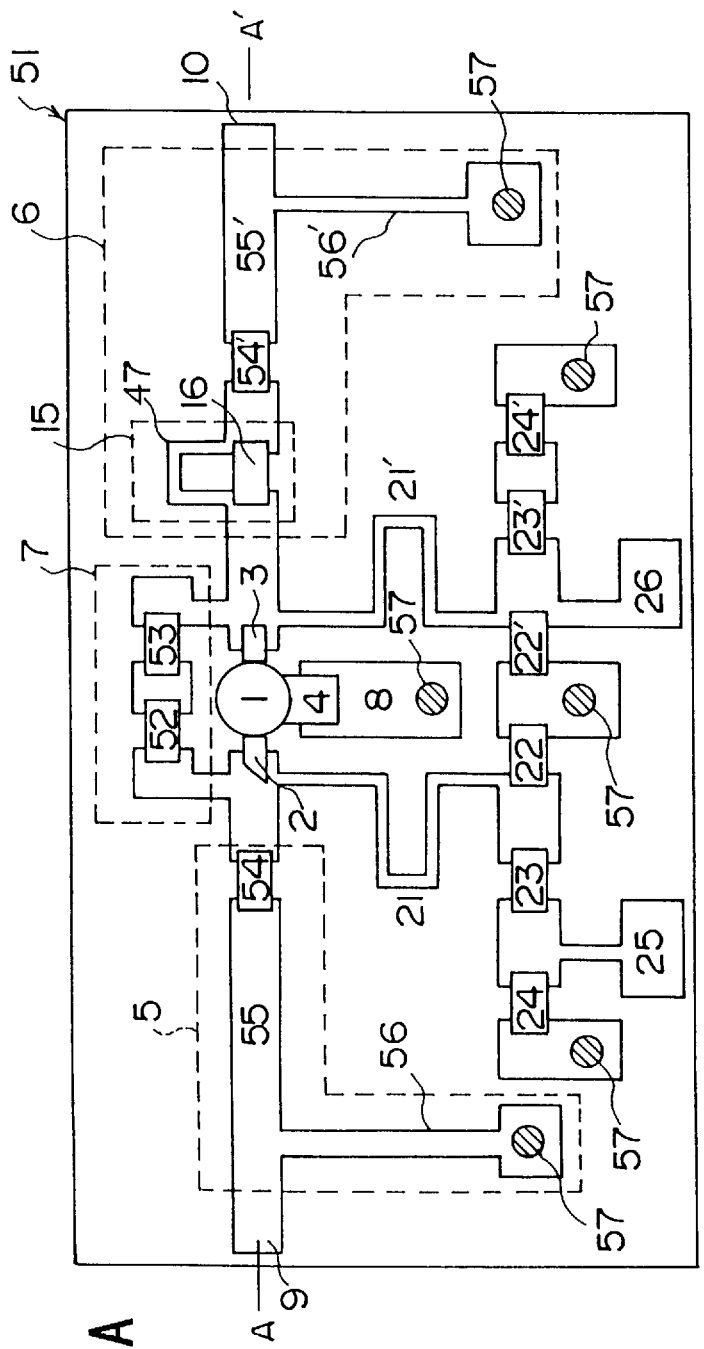
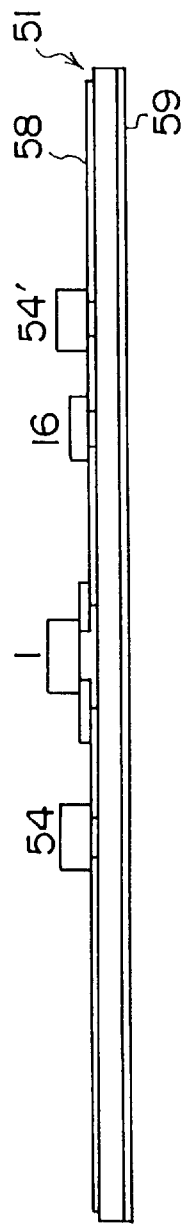
FIG. 13A
FIG. 13B

HIGH FREQUENCY AMPLIFIER, RECEIVER, AND TRANSMITTER SYSTEM

BACKGROUND OF THE INVENTION

1. Field of the Invention

The present invention relates to amplifiers using amplifying elements such as a bipolar transistor and a field effect transistor, and more particularly to an amplifier for processing high frequencies in the microwave band.

2. Description of the Prior Art

FIG. 1 is a block diagram showing a conventional microwave amplifier including negative feedback circuits. The circuit shown in FIG. 1 comprises field effect transistor (hereinafter, referred to as FET) 1, an input matching circuit 5, an output matching circuit 6, a first negative feedback circuit 8 and a second negative feedback circuit 7. The input matching circuit 5 is provided between an input terminal 9 of the amplifier and the gate 2 of the FET 1 so as to match the input impedances. The output impedance matching circuit 6 is provided between the drain 3 of the FET 1 and an output terminal 10 of the amplifier so as to match the output impedances. The first negative feedback circuit 8 is mainly constituted of an inductive circuit element, and has an end connected to the source of the FET 1 and the other end set to a reference potential such as the ground potential. The second negative feedback circuit 7 is mainly constituted of a resistive element and a capacitive element connected in series, and is connected across the gate 2 and the drain 3 of the FET 1. A bipolar transistor, instead of the FET, may be used as an active amplifying element.

Recently, various high-performance amplifying elements capable of amplifying high frequencies in the microwave band. These elements include a high electron mobility transistor (HEMT) and a heterojunction bipolar transistor (HBT). If these transistors are used in conjunction with the first negative feedback circuit 8 in the circuit of FIG. 1, a parasitic oscillation having a frequency three to eight times higher than a target frequency for amplification occurs. A parasitic oscillation could occur even if a normal transistor is used. The presence of a parasitic oscillation has a seriously unfavorable effect on the performance of the amplifier. Therefore, it is essential that some scheme must be devised to prevent a parasitic oscillation from occurring. A parasitic oscillation is most significant when a transistor having a particularly high performance is used. A particularly high performance in this case refers to a capability to amplify a maximum frequency of 20 GHz or higher.

FIG. 2 shows a stability index curve 301 of a GaAs MESFET having a capability of amplifying a maximum frequency of 20 GHz and a stability index curve 302 of a GaAs MESFET having a capability of amplifying a maximum frequency of 23 GHz. The curve 301 indicates that the transistor capable of processing a maximum frequency of 20 GHz has the lowest stability index of 0.88 and is therefore capable of operating stably for most practical purposes. The curve 302 indicates that the transistor for a maximum frequency of 23 GHz has the lowest stability index of 0.76, meaning that it is very likely that a parasitic oscillation occurs in the latter transistor. To summarize, a transistor having a capability of amplifying a maximum frequency higher than 20 GHz is more likely to suffer from a parasitic oscillation than other transistors.

The stability index (hereinafter, indicated by K) is given by the following equation using a scattering parameter, which is a four-terminal network constant.

$$K=(1+|S_{11}S_{12}-S_{12}S_2|^2-|S_{11}|^2-|S_{22}|^2)/2|S_{12}| |S_{21}|$$

If K is smaller than 1, the amplifier is stable under a certain load condition. As K becomes smaller, the condition which allows a stable performance becomes restricted; in other words, an oscillation is more likely to occur. If K is greater than 1, the performance is stable under any load condition and no oscillation occurs.

As has been described, high-performance transistors capable of amplifying a frequency higher than 20 GHz include a HEMT and an HBT.

In amplifier circuits using vacuum tubes, a general practice is that a coil (peaking coil) is wound around a load resistance connected to a plate.

However, it has been held that it is impossible to apply a peaking coil used in a HF band vacuum tube circuit to a high-performance amplifying element like a HEMT.

FIG. 3 is a Smith chart showing a zone in which the performance of the gate of a HEMT becomes unstable (hereinafter, this zone will be referred to as a gate unstable zone). FIG. 4 is a Smith chart showing a zone in which the performance of the drain of a HEMT becomes unstable (hereinafter, this zone will be referred to as a drain unstable zone). As shown in FIGS. 3 and 4, both the gate unstable zone and the drain unstable zone reside in the inductive impedance zone. Particularly, the drain unstable zone spreads in the entirety of the inductive impedance zone.

Thus, it has been thought that it is impossible to employ an inductive element like a peaking coil in a high-performance amplifying element. Therefore, for the purpose of avoiding a parasitic oscillation, the first negative feedback circuit 8 is conventionally omitted. However, if the first negative feedback circuit 8 is omitted, the input impedance of the amplifier cannot be set to the impedance of a preceding stage or a predetermined impedance which enables a desired low-noise characteristic to be obtained. As a result, it is impossible to obtain a desired characteristic of the input matching circuit 5. The input matching circuit 5 is designed to set relevant parameters so that the low-noise characteristic and the impedance matching characteristic are desirably configured. If the first negative feedback circuit 8 is omitted, neither characteristic can be desirably configured; one of the characteristics suffers.

SUMMARY OF THE INVENTION

Accordingly, it is an object of the present invention to provide a highly stable amplifier in which the aforementioned disadvantages of the conventional technology are eliminated.

Another and more specific object of the present invention is to provide a stable amplifier in which a parasitic oscillation is prevented without a deterioration in the low-noise characteristic.

In order to achieve the aforementioned objects, the present invention provides an amplifier which is equipped with an input terminal and an output terminal and has a transistor as an amplifying element, the amplifier comprising: a negative feedback circuit provided in the transistor; and a parallel circuit which includes an inductive element and a resistive element connected in series between the input terminal of the amplifier and an input terminal of the transistor, or between the output terminal of the amplifier and an output terminal of the transistor. According to the amplifier of the present invention, the negative feedback circuit feeds an output signal to an input terminal so as to stabilize the performance of the amplifier. In combination with the negative feedback circuit, the parallel circuit comprising the inductive circuit element and the resistive element functions to maintain a low-noise characteristic and a high stability and to prevent a parasitic oscillation from occurring in a wide frequency band, particularly in a high frequency band.

The parallel circuit may be provided between the input terminal of said amplifier and the input terminal of said transistor, and also between the output terminal of said amplifier and the output terminal of said transistor. According to this aspect of the present invention, the aforementioned effects of the present invention can be enhanced.

The amplifier may also comprise: a first impedance matching circuit coupled to the input terminal of said amplifier; and a second impedance matching circuit coupled to the output terminal of said amplifier. In the above-described construction, wherein the parallel circuit is used in combination with the negative feedback circuit, the first impedance matching circuit functions to effect the input impedance matching and enables a low-noise characteristic to be obtained.

In a preferred embodiment, the negative feedback circuit is provided between the input terminal of the transistor and the output terminal of the transistor. According to this aspect of the present invention, the negative feedback circuit functions to prevent a parasitic oscillation in a low frequency band from occurring.

In another preferred embodiment, the negative feedback circuit is provided between a predetermined potential point and a transistor terminal other than transistor terminals connected to the input terminal or the output terminal of said amplifier. In an alternative approach, two negative feedback circuits may be provided: one between the input terminal of said transistor connected to the input terminal of said amplifier and the output terminal of said transistor connected to the output terminal of said amplifier; and the other between a predetermined potential point and a transistor terminal other than said transistor terminals connected to the input terminal or the output terminal of said amplifier. According to this aspect of the present invention, the input impedance matching can be properly effected without degrading the low-noise characteristic, and the stability of the amplifier is improved.

Preferably, the amplifier further comprises: a first direct current blocking circuit provided between the input terminal of said amplifier and the input terminal of said transistor connected to said amplifier; and a second direct current blocking circuit provided between the output terminal of said amplifier and the output terminal of the transistor connected to said amplifier. According to this aspect of the present invention, it is possible to obtain a stable amplifier not affected by a direct current component.

The amplifier may further comprise a bias circuit for providing a bias to said transistor. According to this aspect of the present invention, the bias circuit functions to enable a desired dynamic characteristic of the circuit to be obtained.

Preferably, the transistor has a capability of amplifying a maximum frequency of 20 GHz or higher. According to this aspect of the present invention, the aforementioned effects of the present invention, i.e., the low-noise characteristic, the prevention of the parasitic oscillation and the high stability of the amplifier are achieved using a transistor having a maximum frequency of 20 GHz or higher.

In a preferred embodiment, the resistive element and the inductive element constituting said parallel circuit are formed individually on a circuit substrate and connected in parallel. According to this aspect of the present invention, the parallel circuit can be produced easily.

In another preferred embodiment, at least one of said negative feedback circuit, the inductive element and the resistive element is provided on a semiconductor substrate on which said transistor is formed. According to this aspect of the present invention, the production of the amplifier is easy. Those elements that are not provided on the semiconductor substrate may be provided externally.

The present invention also provides a receiver comprising: an amplifier coupled to an antenna; a first filter coupled to said amplifier; a mixer for mixing an output of a bandpass filter with a local oscillation signal; and a second filter coupled to the mixer, wherein said amplifier has a construction of the present invention. According to the receiver of the present invention, the low-noise characteristic and the high stability can be achieved. The parasitic oscillation is prevented from occurring because the amplifier has the favorable construction provided by the present invention.

The present invention also provides a communication unit having a transmitter system and a receiver system, wherein said receiver system comprises: an amplifier coupled to an antenna; a first filter coupled to said amplifier; a mixer for mixing an output from a bandpass filter with a local oscillation signal; and a second filter coupled to the mixer, wherein said amplifier has the construction provided by the present invention. According to the communication unit of the present invention, the low-noise characteristic and the high stability can be achieved. The parasitic oscillation is prevented from occurring because the amplifier has the favorable construction provided by the present invention.

BRIEF DESCRIPTION OF THE DRAWINGS

Other objects and further features of the present invention will be apparent from the following detailed description when read in conjunction with the accompanying drawings, in which:

FIG. 13A is a top view of a device obtained by forming the construction shown in FIG. 12 on an dielectric substrate;

FIG. 13B is a longitudinal sectional view taken along the line A—A' of FIG. 13A;

DESCRIPTION OF THE PREFERRED EMBODIMENTS

Figure 1:
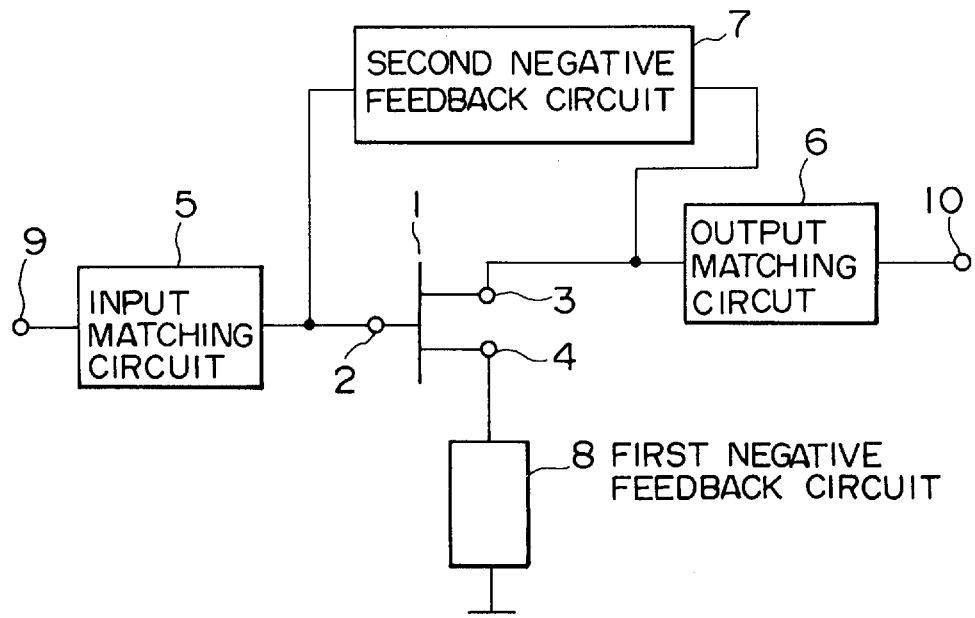
FIG. 1 is a block diagram showing a conventional amplifier.
Figure 2:
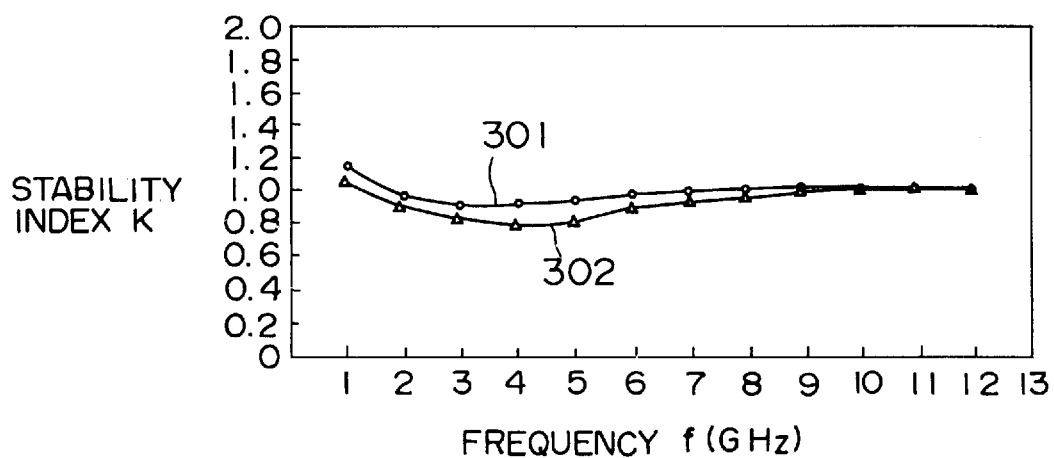
FIG. 2 is a graph which explains an stability index of two MESFETs.
Figure 3:
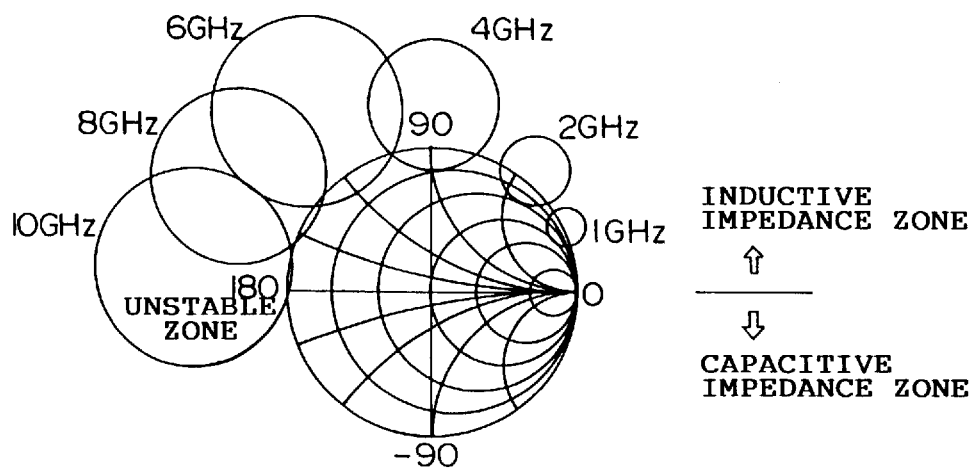
FIG. 3 is a Smith chart showing a zone in which the gate of a HEMT is unstable.
Figure 4:
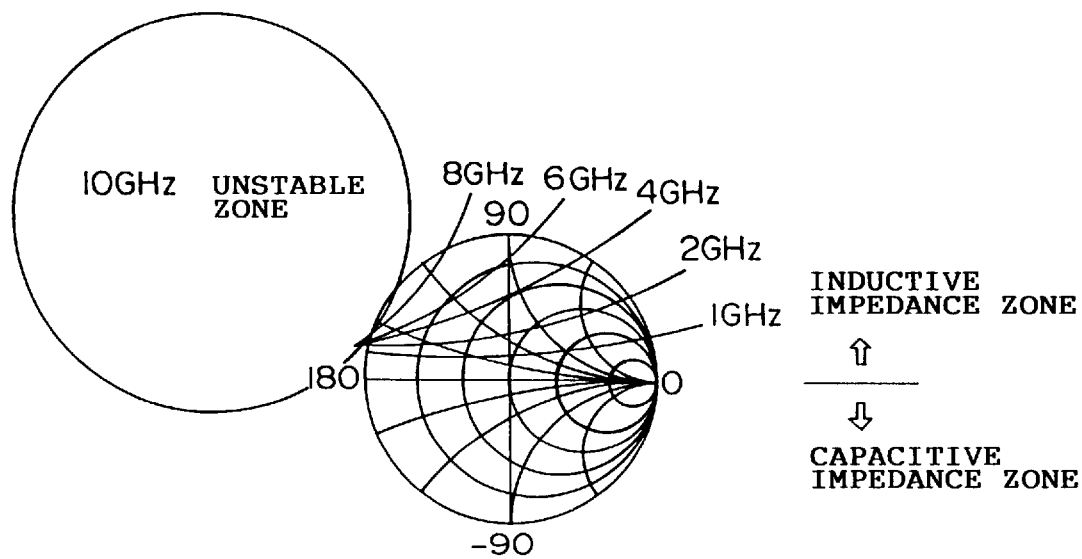
FIG. 4 is a Smith chart showing a zone in which the drain of a HEMT is unstable.
Figure 5:
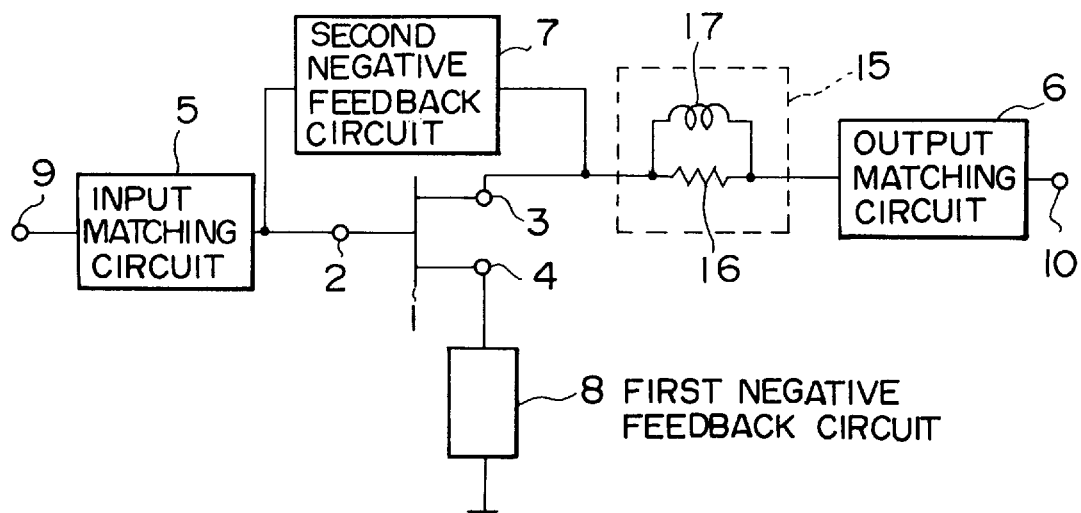
FIG. 5 is a block diagram of a first embodiment of the present invention.

FIG. 5 is a block diagram showing a first embodiment of the present invention. In FIG. 5, those components that are the same as the components of FIG. 1 are designated by the same reference numerals. The amplifier shown in FIG. 5 has a function of amplifying a signal in the microwave band and is an improvement upon the construction of FIG. 1 in that a parallel circuit 15 including a resistive element 16 and a coil 17 are connected in parallel is provided. Before a detailed description of the parallel circuit 15 is given, the other aspects of the amplifier will be described.

The input matching circuits and the output matching circuit 6 are mainly formed of a distributed constant circuit. The second negative feedback circuit 7 is constituted of a resistive element and a capacitive circuit element connected in series. The line connecting the second negative feedback circuit 7 to the FET 1 embodied by a HEMT or an HBT includes a floating inductance component. The first negative feedback circuit 8 is constituted of a coil, a plane spiral coil or a line having a length below $\lambda/4$ ($\lambda$ signifies a wavelength derived from a target frequency for amplification).

The inductive circuit element 17 of the parallel circuit 15 is embodied by a coil, a plate spiral coil, or a distributed constant line wherein a preselected constant provides a low impedance while the amplifier is processing a signal having a target frequency and a high impedance while the amplifier is processing a signal having a frequency (for example, a frequency higher than 5 GHz) that does not belong to the target frequency zone. In the construction shown in FIG. 5, the parallel circuit 15 is provided between the drain 3 of the FET 1 and the output matching circuit 6. However, the parallel circuit 15 may be provided between the output matching circuit 6 and the output terminal 10, between the input terminal 9 and the input matching circuit 5, or between the input matching circuit 5 and the gate 2 (see FIG. 12). Another parallel circuit having a similar construction may be provided in any of the above-mentioned positions in addition to the parallel circuit 15 shown in FIG. 5. The parallel circuit 15 may be built as part of an input bias circuit, as part of the output matching circuit 6, or as part of an output bias circuit.

A description will now be given of the first negative feedback circuit 8 in the microwave amplifier shown in FIG. 5.

The first negative feedback circuit 8 has an input matching function whereby a low-noise characteristic is obtained by setting relevant parameters of the input matching circuit 5 to an appropriate value and also has an input impedance matching function (for example, the impedance is matched to 50 $\Omega$ or an impedance of a preceding stage). The first negative feedback impedance circuit 8 also has a function of modifying the stability of the entire circuit.

Figure 6:
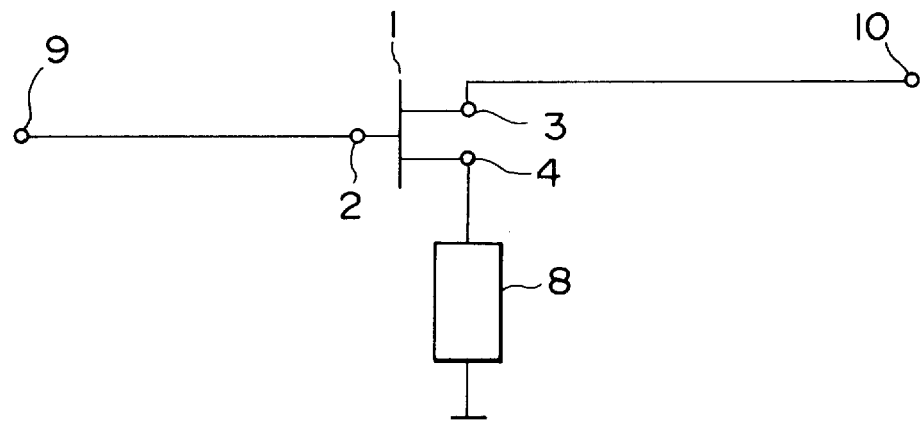
FIG. 6 is a block diagram of a circuit used in an experiment for obtaining a stability index provided by a construction in which a HEMT and a negative feedback circuit are used.
Figure 7:
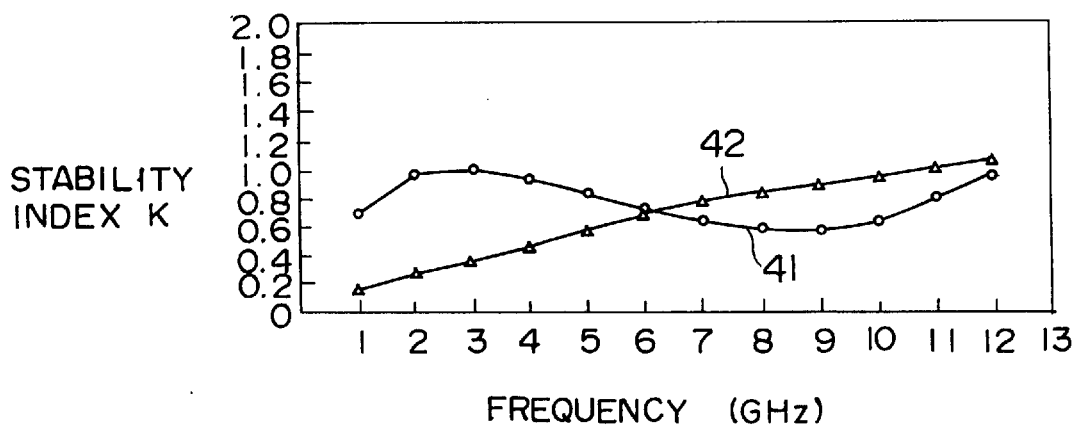
FIG. 7 is a graph showing a stability index provided by a construction in which a HEMT and a negative feedback circuit are used.

FIG. 6 shows a circuit in which a HEMT is used as a transistor and only the first negative feedback circuit 8 is used. A curve 41 in the graph of FIG. 7 indicates a stability index with the frequency which index is provided by the circuit shown in FIG. 6. A curve 42 in the graph of FIG. 7 indicates a stability index of the HEMT itself used in the experiment. The curve 42 shows that the stability index of the HEMT drops below 1 in a frequency band below 11 GHz. As the frequency gets lower, the stability index becomes lower. The curve 41 indicating the stability provided by the circuit formed of the FET (HEMT) 1 and the first negative feedback circuit 8 shows that the stability index is approximately 1 in a frequency band of 2–3 GHz and drops below 1 in the other frequency bands. Of particular note is the fact that the stability index indicated by the curve 41 drops below 0.6 in a frequency band of 8–9 GHz, meaning that the amplifier is unstable.

Figure 8:
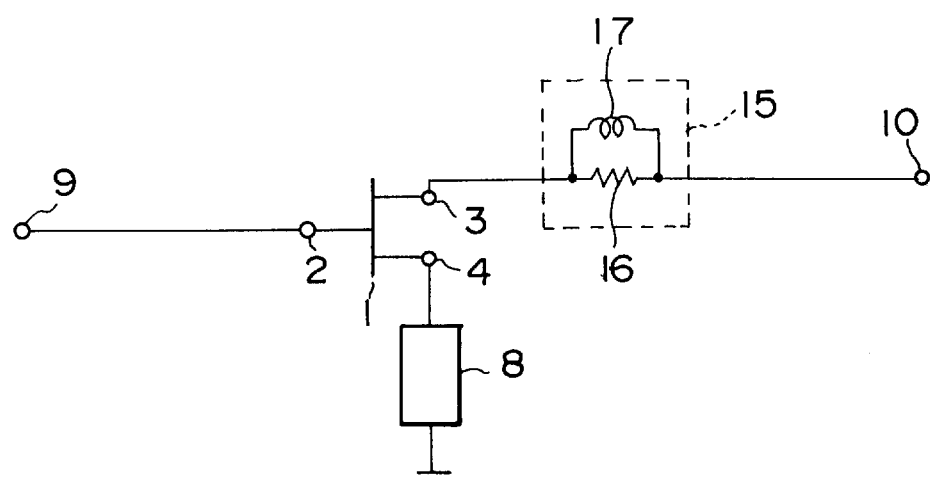
FIG. 8 is a block diagram showing a construction in which a parallel circuit of the first embodiment is added to the construction shown in FIG. 6.
Figure 9:
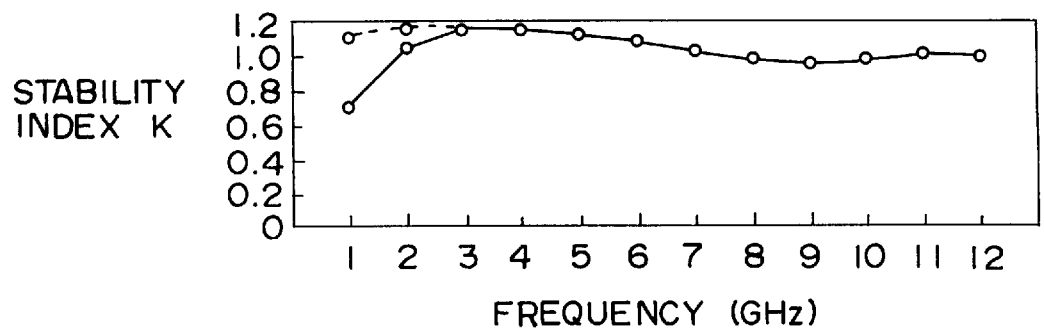
FIG. 9 is a graph showing the stability index provided by the construction shown in FIG. 8.

On the basis of the above-described experimental result, the present inventors measured the stability index with the frequency using a configuration in which the parallel circuit 15 having the resistive element 16 and the inductive circuit element 17 is connected to the construction shown in FIG. 6. The result obtained through the measurement is shown in FIG. 9. It is learned from FIG. 9 that the construction shown in FIG. 8 provides a stability index equal to or greater than 1 in a frequency band beyond 2 GHz. Although sometimes dropping below 1, the stability index remains close to 1 throughout this frequency band. The graph of FIG. 9 also shows that the stability index is below 1 in a frequency band below 2 GHz. Thus, it is determined that, while connecting an inductive circuit element to the gate or the drain of the FET (such as a HEMT) has been thought of as inappropriate, our study shows that the stability of the amplifier is actually improved and production of parasitic oscillation is restrained, if the inductive circuit element is used in conjunction with the first negative feedback circuit 8 connected to the source 4 of the FET 1.

The second negative feedback circuit 7 functions to raise the stability index beyond 1 in the neighborhood of 2 GHz or in a frequency zone lower than 2 GHz. When a value of resistance of the resistive element used in the second negative feedback circuit 7 becomes lower, the gain drops and the noise increases. Therefore, it is preferable that a value of resistance of the resistive element be such that a degradation in the noise characteristic is 0.1–0.3 dB. If the second negative feedback circuit 7 is added to the construction of FIG. 8, the stability index is improved in a frequency band below 3 GHz, as indicated by a broken line of FIG. 9. Accordingly, it is desirable that the second negative feedback circuit is used in conjunction with the first negative feedback circuit 8 when it is necessary to amplify a signal having a frequency in the neighborhood of 2 GHz. A construction in which the second negative feedback circuit 7 shown in FIG. 6 is omitted is shown in FIG. 10.

Figure 10:
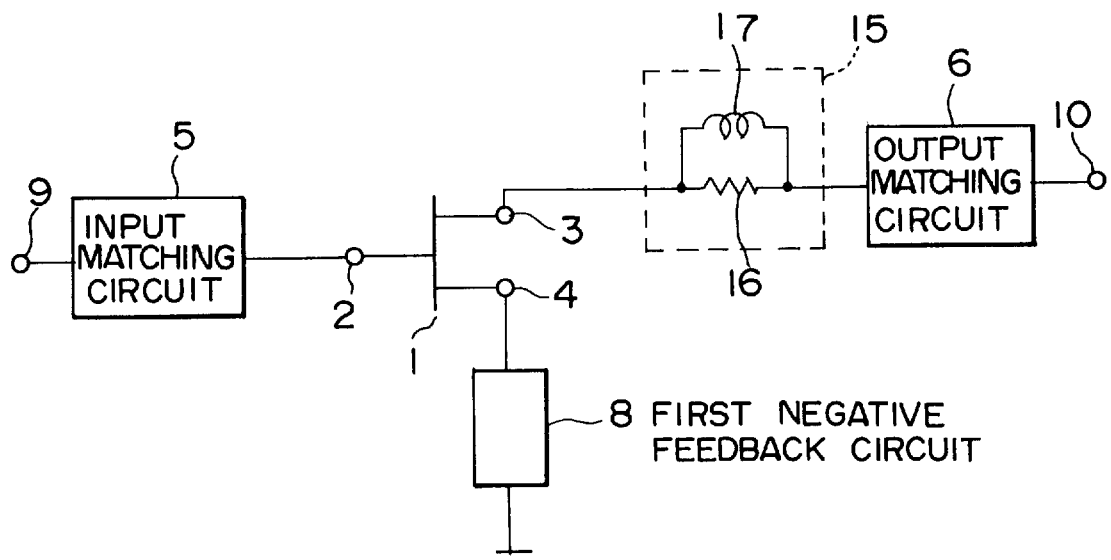
FIG. 10 is a block diagram showing a construction obtained by adding an input matching circuit and an output matching circuit to the construction shown in FIG. 9.
Figure 11:
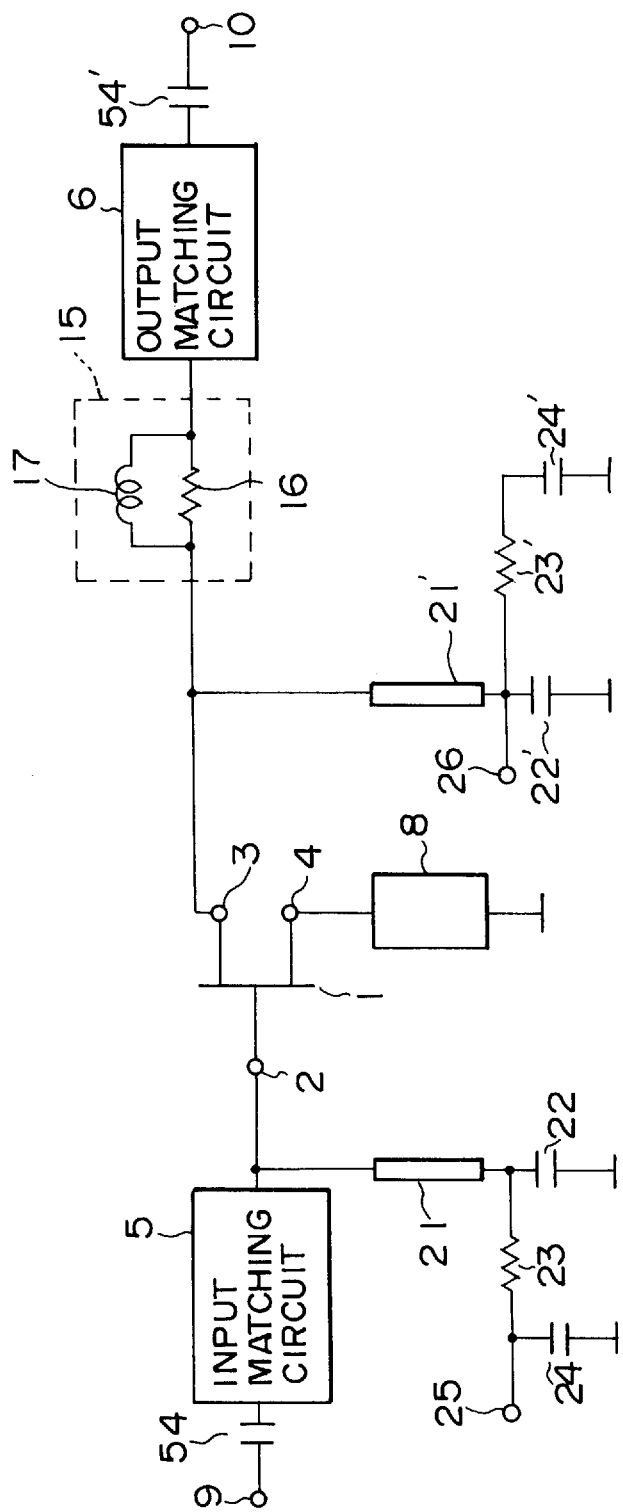
FIG. 11 is a block diagram showing a construction obtained by adding a bias circuit to the construction shown in FIG. 10.

FIG. 11 is a block diagram showing a construction in which two bias circuits are added to the circuit of FIG. 10. Referring to FIG. 11, those components that are the same as the components shown in the figures hitherto described are designated by the same reference numerals. A bias circuit is provided adjacent to the gate of the FET 1, and the other bias circuit is provided adjacent to the drain. These bias circuits have a construction described below.

The distributed constant circuits 21 and 21' are connected to the gate 2 and the drain 3 of the FET 1, respectively. For example, the line length of the distributed circuits 21 and 21' is λ/8–3λ/8, λ being a wavelength derived from a target frequency for amplification. Bypass capacitors 22 and 22' are connected to the distributed constant lines 21 and 21', respectively, so as to bypass the target frequency for amplification. The bypass capacitors 22 and 22' may be replaced by a distributed constant line having one end open. The capacitor 24 bypasses the high frequency in a wide frequency band lower than the target frequency for amplification. In this low and wide frequency band, the stability of the circuit is improved because the parallel circuit comprising a resistive element 23 and the capacitor 22 is connected to the terminal 2 of the FET 1 so as to provide a capacitive impedance. A resistive element 23' and a capacitor 24' at the drain functions the same way. A gate bias signal (voltage) is supplied to a bias terminal 25, and a drain bias signal (voltage) is supplied to a bias terminal 26. The aforementioned two bias circuits function to increase the value of K in a frequency band lower than the target frequency for amplification. One of the two series circuits, that is, the circuit formed of the elements 23 and 24 and the circuit formed of the elements 23' and 24' may be omitted. A coupling capacitor 54 for cutting off the dc component is provided between the input terminal 9 and the input matching circuit 5. A coupling capacitor 54' for cutting off the dc component is provided between the output terminal 10 and the output matching circuit 6.

Figure 12:
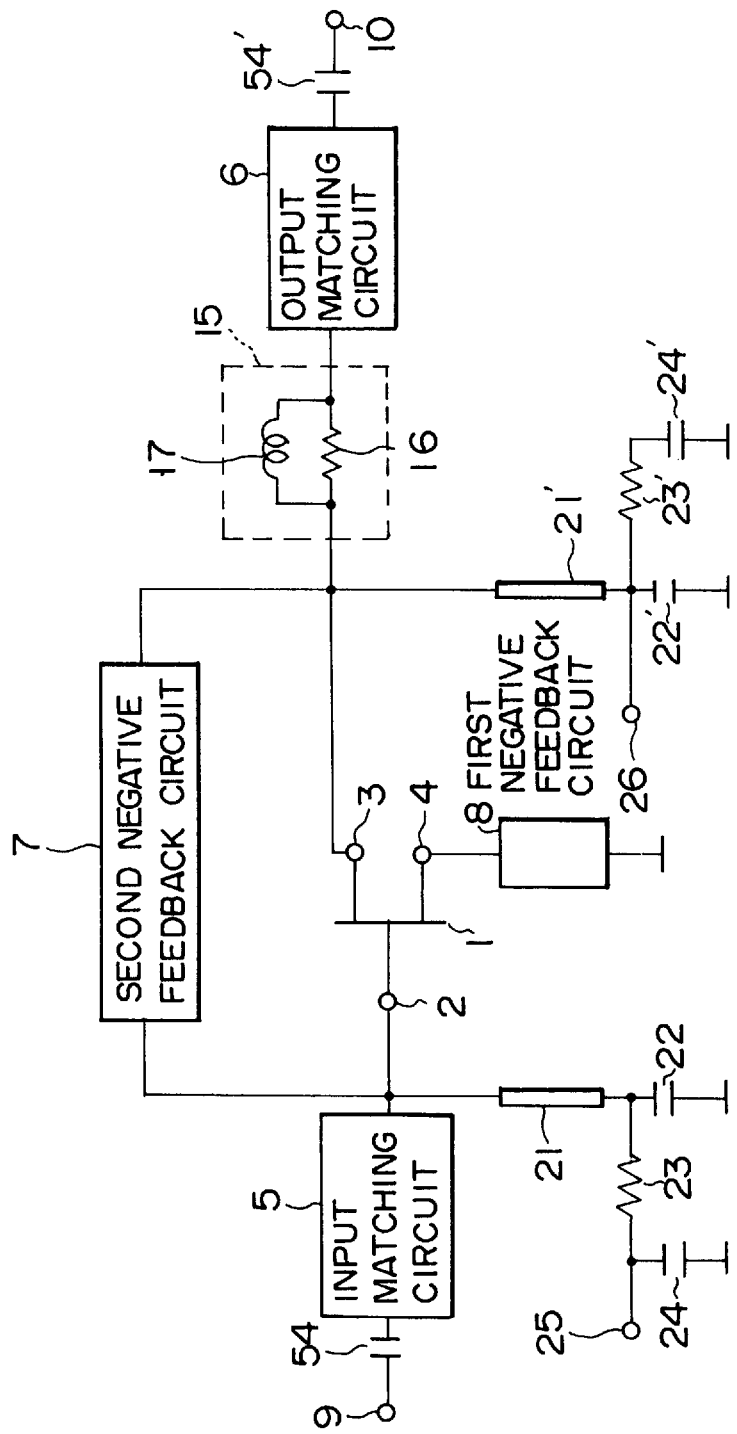
FIG. 12 is a block diagram showing a construction obtained by adding a negative circuit to the construction shown in FIG. 11.

FIG. 12 shows a construction in which the second negative feedback circuit is added to the circuit of FIG. 11. The stability index, with the frequency, provided by this construction is indicated by a broken line shown in FIG. 9.

As has been described, the first embodiment of the present invention provides the following effects.

(1) The low-noise characteristic and the input impedance matching can be realized at the same time. The stability index K can be maintained greater than 1 over a very wide frequency band while at the same time the parasitic oscillation is prevented.

(2) A practical and high-performance circuit can be realized in that high-performance, inexpensive transistors such as a HEMT and HBT can be used at a frequency band lower than 8 GHz.

FIG. 13A is a top view of the microwave amplifier shown in FIG. 12, wherein circuit elements are formed or mounted on a dielectric substrate 51 covered by a metal film. FIG. 13B is a longitudinal sectional view taken along the line A—A' of FIG. 13A. The resistive elements 16, 23 and 23' are constructed as chip resistors. A resistive element 52, also a chip resistor, is a constituent part of the second negative feedback circuit 7. The capacitors 22, 22', 24, 24', 54 and 54' are constructed as chip capacitors. A capacitor 53, also a chip capacitor, is a constituent part of the second negative feedback circuit 7. The resistive elements, the capacitors and the FET 1 are soldered to a circuit electrode 58 formed of a copper foil or the like provided on the dielectric substrate 51. The dielectric substrate 51 is produced such that both surfaces of an dielectric body is covered by a copper foil and a pattern is produced using a drilling process, a through hole production process and an etching technology. The patterned circuit electrode 58 on the surface of the dielectric substrate 51 constitutes the circuit elements other than the resistors and the capacitors. The backside of the dielectric substrate is covered by a copper foil 59 except those parts that are drilled.

The input matching circuit 5 comprises a transmission line 55, the coupling capacitor 54 and a transmission line 56 having an end grounded via a through hole 57. The output matching circuit 56 comprises a transmission line 55', the coupling capacitor 54', a transmission line 56' having an end grounded via a through hole 57 and the parallel circuit 15 having a transmission line 47 functioning as an inductive circuit element and the resistive element 16 connected in parallel. The second negative feedback circuit 7 comprises the resistive element 52, the capacitor 53 and a line provided to connect the two. The first negative feedback circuit 8 is constructed of a transmission line having an end grounded via the through hole 57. The FET 1 is embodied by a HEMT, and the gate bias circuit connected to the gate 2 of the FET 1 comprises a λ/4 line 21 having a favorable characteristic impedance, the capacitors 22 and 24, the resistive elements 23 and a line connecting these elements electrically. The bias circuit connected to the drain 3 of the FET 1 comprises a λ/4 line 21' having a favorable characteristic impedance, the capacitors 22' and 24', the resistive elements 23' and a line connecting these elements electrically.

The circuit components mounted on the dielectric substrate 51 and the layout of the components can be determined arbitrarily. Therefore, the construction of the microwave amplifier is not limited to that of FIGS. 13A and 13B.

Figures 14A, 14B:
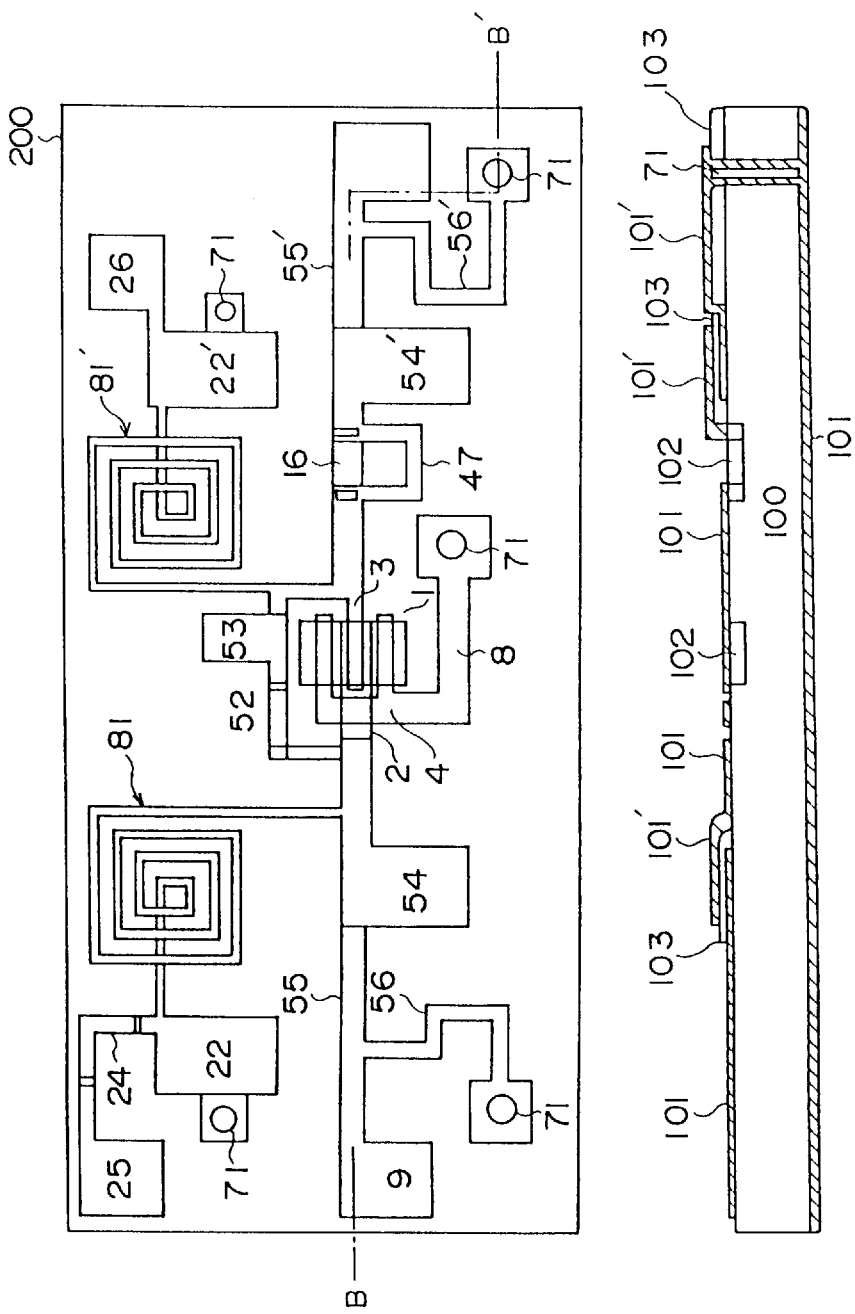
FIG. 14A is a top view of a device obtained by forming the construction shown in FIG. 12 as an MMIC device.
FIG. 14B is a longitudinal sectional view taken along the line B—B' of FIG. 14A.

FIG. 14A is a top view of a monolithic microwave IC (MMIC) 200 built by integrating the microwave amplifier shown in FIGS. 13A and 13B into one chip. FIG. 14B is a longitudinal sectional view taken along the line B—B' of FIG. 14A. Those components that are the same as the components described before are designated by the same reference numerals. Resistive layers 102 and 102' having a low value of resistance are formed by pumping impurities into parts of a surface layer of an insulating gallium arsenide crystal substrate 100 using an ion plantation technique. The resistive layer 102 functions as a resistive element and the resistive layer 102' functions as an active layer of the FET 1. A first metal layer 101 having a high conductivity is formed on the surface of the resistive layer 102, using an evaporation technique or a plating technique. Unnecessary portions of the metal layer 101 is eliminated using an optical etching technique. An insulating layer 103 formed of $SiO_2$, $Si_3N_4$ or a polyimide is provided on the metal layer 101. The insulating layer 103 provides insulation where electrodes cross each other, i.e., insulation in spiral coils 81 and 81', and insulation between the gate electrode 2 and the source electrode 4 of the FET 1. The insulating layer 103 also functions as an insulating layer between the first metal layer 101 and the second metal layer 102 in the capacitors 22, 22', 54 and 54'. A second metal layer 101' is formed on top of the insulating layer 103. The spiral coils 81 and 81' have the same function as the aforementioned λ/4 line. A lower electrode of the capacitors 22 and 22', and the end of the transmission lines 56 and 56' are connected to the electrode 101' at the backside via a via hole 71.

The MMIC shown in FIGS. 14A and 14B is accommodated in a package (not shown) as the case demands.

Figure 15:
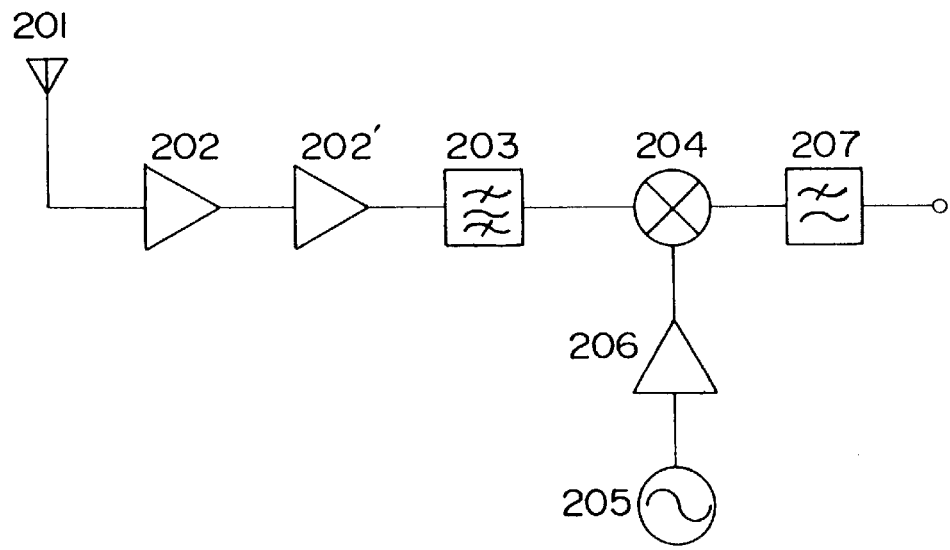
FIG. 15 is a block diagram of a receiver according to a second embodiment of the present invention, to which receiver the first embodiment is applied.

FIG. 15 is a block diagram of a receiver having the microwave amplifier of the present invention mounted thereon. A description will now be given of this receiver as a second embodiment of the present invention. Those components that are the same as the components described before are designated by the same reference numerals.

The receiver shown in FIG. 15 comprises an antenna 201, microwave amplifiers 202 and 202', a band-pass filter 203, a mixer 204, a local oscillator 205, a microwave amplifier 206 and a low-pass filter 207. A minute signal received by the antenna 201 is amplified to have a desired power by the amplifiers 202 and 202'. The band-pass filter 203 feeds the minute signal to the mixer 204 after eliminating unnecessary signals and the noise. A high-frequency signal generated by the local oscillator 205 and having only one frequency component is amplified by the amplifier 206 to have a desired power. An IF signal having a frequency (intermediate frequency or baseband) equal to a difference between the received signal frequency and the high frequency generated by the local oscillator 205 is created in the mixer 204. The IF signal is fed to the low-pass filter so that the desired signal is obtained.

The microwave amplifiers 202 and 202' are constructed according to the first embodiment described earlier. Demodulators etc. connected to the filter 207 are omitted from the illustration.

The construction shown in FIG. 15 is applicable to devices such as a receiver for receiving microwaves projected by a satellite or a portable telephone set.

Figure 16:
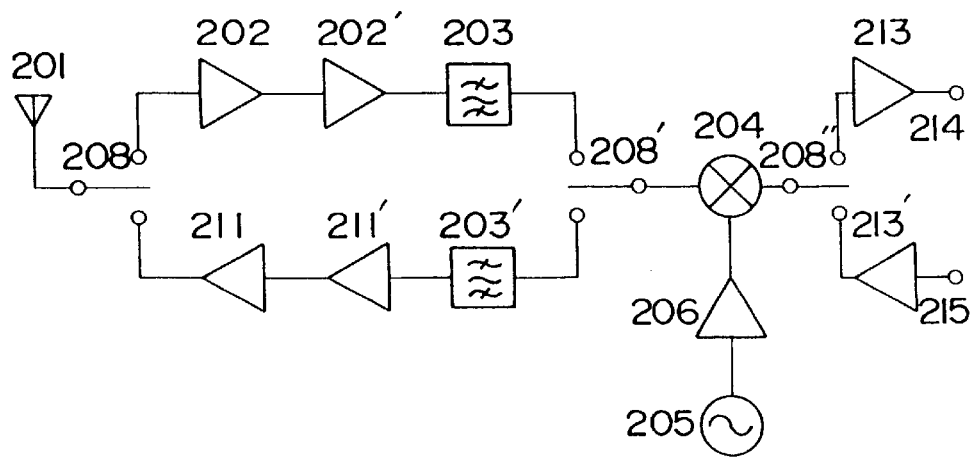
FIG. 16 is a block diagram of a communication unit according to a third embodiment of the present invention, to which communication unit the first embodiment is applied.
Figure 17:
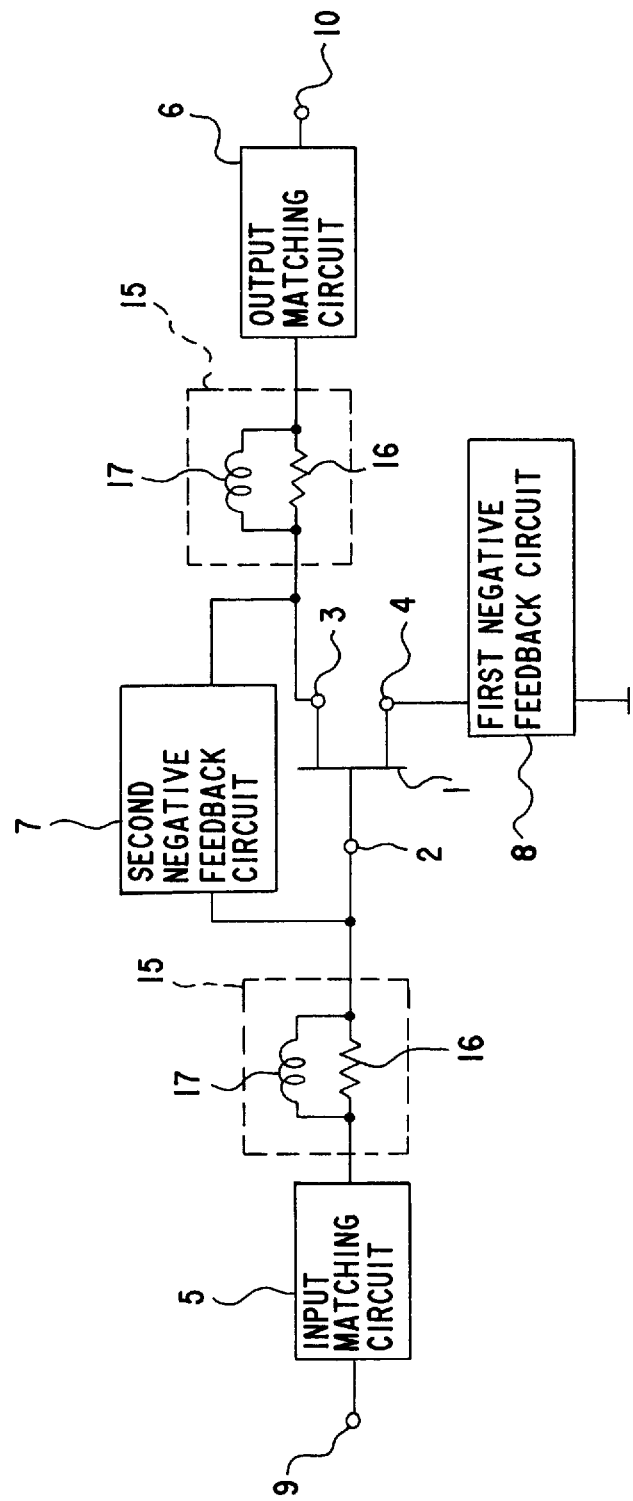
FIG. 17 is a block diagram illustrating the parallel circuit according to another embodiment of the invention.

FIG. 16 is a block diagram of a communication unit having the microwave amplifier of the present invention mounted thereon. A description will now be given of this communication unit as a third embodiment of the present invention. In FIG. 16, those components that are the same as the components described earlier are designated by the same reference numerals.

A receiver system of the communication unit has the microwave amplifiers 202 and 202', and the bandpass filter 203. A transmitter system has power amplifiers 211 and 211', and a bandpass filter 203'. Switches 208 and 208' are used to switch the operation from the transmitter system to the receiver system and vice versa. A moving contact of the switch 208 is connected to the antenna 201. A moving contact of the switch 208' is connected to mixer 204. The mixer 204 is connected to a switch 208". A moving contact of the switch 208" is connected to the mixer 204, and an intermediate amplifier 213 is connected between the switch 208" and a receiver terminal 214. An intermediate-frequency amplifier 213' is connected between the switch 208" and a transmitter terminal 215.

The minute signal received by the antenna 201 is made to pass through the transmitter/receiver switch 208 and amplified by the amplifiers 202 and 202' to have a desired power. The bandpass filter 203 eliminates unnecessary signals and noise so that the signal is fed to the mixer 204 via the switch 208'. The high-frequency signal generated by the local oscillator 205 and having only one frequency component is amplified by the amplifier 206 to have a desired power and fed to the mixer 204. This high frequency performs the same function in the reception and in the transmission.

An IF signal having a frequency (intermediate frequency or baseband) equal to a difference between the received signal frequency and the high frequency generated by the local oscillator 205 is generated in the mixer 204. The IF signal is made pass through the switch 208", amplified by the intermediate-frequency amplifier 213 to have a desired power and fed to the receiver terminal 214.

A baseband signal modulated by a modulator (not shown) is fed to the transmitter terminal 215, amplified by the intermediate-frequency amplifier 213' to have a desired power, made to pass through the switch 208" and fed to the mixer 204. The microwave signal generated in the mixer 204 is made to pass through the switch 208' and has unnecessary frequency components eliminated therefrom by the bandpass filter 203'. Thereafter, the microwave signal is amplified by the power amplifiers 211 and 211' to have a desired power and forwarded to the antenna 201 via the switch 208.

The construction shown in FIG. 16 is applicable to devices such as a transmitter/receiver for use in a base station of the portable telephone, an automobile telephone set or amateur radio.

While an FET is used in the foregoing embodiments, a bipolar transistor may be used alternatively. The input matching circuit and the output matching circuit may include the parallel circuit of the present invention. A chip resistor or a film resistor may be used as a resistive element.

The present invention is not limited to the above described embodiments, and variations and modifications may be made without departing from the scope of the present invention.

What is claimed is:

1. An amplifier which is equipped with an input terminal and an output terminal and has a transistor as an amplifying element, the amplifier comprising:

a first negative feedback circuit provided between a common terminal of said transistor and a around; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, and a second negative feedback circuit provided between the input terminal of said transistor and the output terminal of said transistor.

2. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor; and a second negative feedback circuit between the input terminal of said transistor and the output terminal of said transistor.

3. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor;

a first impedance matching circuit coupled to the input terminal of said amplifier;

a second impedance matching circuit coupled to the output terminal of said amplifier; and a second negative feedback circuit between the input terminal of said transistor and the output terminal of said transistor.

4. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, wherein said first negative feedback circuit is provided between the input terminal of said transistor connected to the input terminal of said amplifier and the output terminal of said transistor connected to the output terminal of said amplifier, said amplifier further comprising a second negative feedback circuit provided between a predetermined potential point and a transistor terminal other than transistor terminals connected to the input terminal or the output terminal of said amplifier.

5. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor, wherein said first negative feedback circuit is provided between the input terminal of said transistor connected to the input terminal of said amplifier and the output terminal of said transistor connected to the output terminal of said amplifier, said amplifier further comprising a second negative feedback circuit provided between a predetermined potential point and a transistor terminal other than said transistor terminals connected to the input terminal or the output terminal of said amplifier.

6. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor;

a first impedance matching circuit coupled to the input terminal of said amplifier;

a second impedance matching circuit coupled to the output terminal of said amplifier;

wherein said first negative feedback circuit is provided between the input terminal of said transistor connected to the input terminal of said amplifier and the output terminal of said transistor connected to the output terminal of said amplifier, said amplifier further comprising a second negative feedback circuit provided between a predetermined potential point and a terminal other than said transistor terminals.

7. The amplifier as claimed in claim 1 further comprising:

a first direct current blocking circuit provided between the input terminal of said amplifier and the input terminal of said transistor connected to said amplifier; and a second direct current blocking circuit provided between the output terminal of said amplifier and the output terminal of the transistor connected to said amplifier.

8. The amplifier as claimed in claim 2 further comprising:

a first direct current blocking circuit provided between the input terminal of said amplifier and the input terminal of said transistor connected to said amplifier; and a second direct current blocking circuit provided between the output terminal of said amplifier and the output terminal of the transistor connected to said amplifier.

9. The amplifier as claimed in claim 1 further comprising a bias circuit for providing a bias to said transistor.

10. The amplifier as claimed in claim 2 further comprising a bias circuit for providing a bias to said transistor.

11. The amplifier as claimed in claim 3 further comprising a bias circuit for providing a bias to said transistor.

12. The amplifier as claimed in claim 1, wherein said transistor has a capability of amplifying a maximum frequency of 20 GHz or higher.

13. The amplifier as claimed in claim 2, wherein said transistor has a capability of amplifying a maximum frequency of 20 GHz or higher.

14. The amplifier as claimed in claim 3, wherein said transistor has a capability of amplifying a maximum frequency of 20 GHz or higher.

15. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, wherein the resistive element and the inductive element constituting said parallel circuit are formed individually on a circuit substrate and connected in parallel.

16. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor, wherein the resistive element and the inductive element constituting said parallel circuit are formed individually on a circuit substrate and connected in parallel.

17. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor;

a first impedance matching circuit coupled to the input terminal of said amplifier;

a second impedance matching circuit coupled to the output terminal of said amplifier, wherein the resistive element and the inductive element constituting said parallel circuit are formed individually on a circuit substrate and connected in parallel.

18. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor;

a first impedance matching circuit coupled to the input terminal of said amplifier; and a second impedance matching circuit coupled to the output terminal of said amplifier, wherein the resistive element and the inductive element constituting said parallel circuit are formed individually on a circuit substrate and connected in parallel.

19. The amplifier as claimed in claim 1, wherein the resistive element and the inductive element constituting said parallel circuit are formed individually on a circuit substrate and connected in parallel.

20. The amplifier as claimed in claim 2, wherein the resistive element and the inductive element constituting said parallel circuit are formed individually on a circuit substrate and connected in parallel.

21. The amplifier as claimed in claim 3, wherein the resistive element and the inductive element constituting said parallel circuit are formed individually on a circuit substrate and connected in parallel.

22. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said negative feedback circuit is provided between a predetermined potential point and a transistor terminal other than transistor terminals connected to the input terminal or the output terminal of said amplifier, and wherein the resistive element and the inductive element constituting said parallel circuit are formed individually on a circuit substrate and connected in parallel.

23. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said parallel circuit is provided between the input terminal of said amplifier and the input terminal of said transistor, and also between the output terminal of said amplifier and the output terminal of said transistor, and wherein said negative feedback circuit is provided between a predetermined potential point and a transistor terminal other than said transistor terminals connected to the input terminal or the output terminal of said amplifier, and wherein the resistive element and the inductive element constituting said parallel circuit are formed individually on a circuit substrate and connected in parallel.

24. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, wherein at least one of said negative feedback circuit, the inductive element and the resistive element is provided on a semiconductor substrate on which said transistor is formed.

25. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor, wherein at least one of said negative feedback circuit, the inductive element and the resistive element is provided on a semiconductor substrate on which said transistor is formed.

26. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor;

a first impedance matching circuit coupled to the input terminal of said amplifier;

a second impedance matching circuit coupled to the output terminal of said amplifier, wherein at least one of said negative feedback circuit, the inductive element and the resistive element is provided on a semiconductor substrate on which said transistor is formed.

27. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element parallel to each other, said parallel circuit being connected in series between the input terminal of said amplifier and an input terminal of said transistor, or between the output terminal of said amplifier and an output terminal of said transistor, said parallel circuit being provided between the input terminal of said amplifier and the input terminal of said transistor, and also between the output terminal of said amplifier and the output terminal of said transistor;

a first impedance matching circuit coupled to the input terminal of said amplifier; and a second impedance matching circuit coupled to the output terminal of said amplifier, wherein at least one of said negative feedback circuit, the inductive element and the resistive element is provided on a semiconductor substrate on which said transistor is formed.

28. The amplifier as claimed in claim 1, wherein at least one of said first negative feedback circuit, said second negative feedback circuit, the inductive element and the resistive element is provided on a semiconductor substrate on which said transistor is formed.

29. The amplifier as claimed in claim 2, wherein at least one of said first negative feedback circuit, said second negative feedback circuit, the inductive element and the resistive element is provided on a semiconductor substrate on which said transistor is formed.

30. The amplifier as claimed in claim 3, wherein at least one of said first negative feedback circuit, said second negative feedback circuit, the inductive element and the resistive element is provided on a semiconductor substrate on which said transistor is formed.

31. An amplifier which is equipped with an terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said negative feedback circuit is provided between a predetermined potential point and a transistor terminal other than transistor terminals connected to the input terminal or the output terminal of said amplifier, and wherein at least one of said negative feedback circuit, the inductive element and the resistive element is provided on a semiconductor substrate on which said transistor is formed.

32. An amplifier which is equipped with an input terminal and an output terminal and has a transistor as an amplifying element, the amplifier comprising:

a first negative feedback circuit provided between a common terminal of said transistor and a ground; and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said parallel circuit is provided between the input terminal of said amplifier and the input terminal of said transistor, and also between the output terminal of said amplifier and the output terminal of said transistor, and wherein said negative feedback circuit is provided between a predetermined potential point and a transistor terminal other than said transistor terminals connected to the input terminal or the output terminal of said amplifier, and wherein at least one of said negative feedback circuit, the inductive element and the resistive element is provided on a semiconductor substrate on which said transistor is formed.

33. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier has a construction as claimed in claim 1.

34. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier has a construction as claimed in claim 2.

35. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier has a construction as claimed in claim 3.

36. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said negative feedback circuit is provided between a predetermined potential point and a transistor terminal other than transistor terminals connected to the input terminal or the output terminal of said amplifier.

37. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said parallel circuit is provided between the input terminal of said amplifier and the input terminal of said transistor, and also between the output terminal of said amplifier and the output terminal of said transistor, and wherein said negative feedback circuit is provided between a predetermined potential point and a transistor terminal other than said transistor terminals connected to the input terminal or the output terminal of said amplifier.

38. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, said amplifier also including a first impedance matching circuit coupled to the input terminal of said amplifier; and a second impedance matching circuit coupled to the output terminal of said amplifier, and wherein said negative feedback circuit is provided between a predetermined potential point and a transistor terminal other than said transistor terminals connected to the input terminal or the output terminal of said amplifier.

39. A receiver comprising:

an amplifier coupled to an antenna;

a first filter coupled to said amplifier;

a mixer for mixing an output of a bandpass filter with a local oscillation signal; and a second filter coupled to the mixer, wherein said amplifier has a construction as claimed in claim 4.

40. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier has a construction as claimed in claim 1.

41. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier has a construction as claimed in claim 2.

42. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier has a construction as claimed in claim 3.

43. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said negative feedback circuit is provided between a predetermined potential point and a transistor terminal other than transistor terminals connected to the input terminal or the output terminal of said amplifier.

44. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, wherein said parallel circuit is provided between the input terminal of said amplifier and the input terminal of said transistor, and also between the output terminal of said amplifier and the output terminal of said transistor, and wherein said negative feedback circuit is provided between a predetermined potential point and a transistor terminal other than said transistor terminals connected to the input terminal or the output terminal of said amplifier.

45. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier is equipped with an input terminal and an output terminal and has a transistor as an amplifying element, said amplifier comprising a first negative feedback circuit provided between a common terminal of said transistor and a ground, and a parallel circuit, provided to suppress oscillation which includes an inductive element and a resistive element connected in series between the input terminal of said amplifier and an input terminal of said transistor, or between the output terminal of said amplifier and an output terminal of said transistor, said amplifier also including a first impedance matching circuit coupled to the input terminal of said amplifier; and a second impedance matching circuit coupled to the output terminal of said amplifier, and wherein said negative feedback circuit is provided between a predetermined potential point and a transistor terminal other than said transistor terminals connected to the input terminal or the output terminal of said amplifier.

46. A communication unit having a transmitter system and a receiver system, wherein said receiver system comprises:

an amplifier coupled to an antenna;

a first filter coupled to said amplifier;

a mixer for mixing an output from a bandpass filter with a local oscillation signal; and a second filter coupled to the mixer, wherein said amplifier has a construction as claimed in claim 4.

* * * * *